(12) United States Patent
Hong et al.

(10) Patent No.: US 11,304,346 B2
(45) Date of Patent: Apr. 12, 2022

(54) METHOD FOR SHIELDING SYSTEM-IN-PACKAGE ASSEMBLIES FROM ELECTROMAGNETIC INTERFERENCE

(71) Applicant: HENKEL IP & HOLDING GMBH, Duesseldorf (DE)

(72) Inventors: Xuan Hong, Irvine, CA (US); Daniel Maslyk, Rancho Santa Margarita, CA (US); Qizhuo Zhuo, Irvine, CA (US); Juliet Grace Sanchez, Carson, CA (US)

(73) Assignee: Henkel AG & Co. KGaA, Dusseldorf (DE)

( * ) Notice: Subject to any disclaimer, the term of this patent is extended or adjusted under 35 U.S.C. 154(b) by 0 days.

(21) Appl. No.: 17/039,102

(22) Filed: Sep. 30, 2020

(65) Prior Publication Data

US 2021/0092884 A1   Mar. 25, 2021

Related U.S. Application Data

(60) Division of application No. 16/680,621, filed on Nov. 12, 2019, now Pat. No. 10,834,858, which is a continuation of application No. PCT/US2019/016225, filed on Feb. 1, 2019.

(60) Provisional application No. 62/625,162, filed on Feb. 1, 2018.

(51) Int. Cl.
*H01L 23/552* (2006.01)
*H01L 21/78* (2006.01)
*H05K 9/00* (2006.01)
*H05K 1/02* (2006.01)

(52) U.S. Cl.
CPC .......... *H05K 9/0084* (2013.01); *H01L 21/78* (2013.01); *H01L 23/552* (2013.01); *H05K 1/0218* (2013.01); *H05K 9/0024* (2013.01)

(58) Field of Classification Search
CPC .............................. H01L 21/78; H01L 23/552
See application file for complete search history.

(56) References Cited

U.S. PATENT DOCUMENTS

| | | | |
|---|---|---|---|
| 8,212,340 B2 | 7/2012 | Liao | |
| 8,420,437 B1 | 4/2013 | Fan | |
| 8,769,811 B2 | 7/2014 | Wurzel et al. | |
| 8,853,562 B2 | 10/2014 | Izawa et al. | |
| 9,526,195 B2 | 12/2016 | Su | |
| 9,536,841 B2 | 1/2017 | Wu | |
| 2004/0231872 A1 | 11/2004 | Arnold et al. | |
| 2006/0148370 A1 | 7/2006 | Kadono et al. | |
| 2007/0023902 A1 | 2/2007 | Song et al. | |
| 2008/0067650 A1 | 3/2008 | Sham et al. | |

(Continued)

FOREIGN PATENT DOCUMENTS

WO   2017171813 A1   10/2017

*Primary Examiner* — Hung V Ngo
(74) *Attorney, Agent, or Firm* — Steven C. Bauman

(57) ABSTRACT

A method for shielding a system-in-package (SIP) assembly from electromagnetic interference (EMI) includes laminating a pre-form EMI shielding film onto the assembly in a single lamination process. The EMI shielding film may be moldable in a vacuum lamination process to cover the SIP assembly and to substantially fill trenches formed in the assembly between adjacent component modules. The SIP assembly is accordingly shielded from EMI through the application of a single EMI shielding film.

1 Claim, 10 Drawing Sheets

(56) References Cited

U.S. PATENT DOCUMENTS

| | | |
|---|---|---|
| 2008/0174013 A1 | 7/2008 | Yang et al. |
| 2008/0179717 A1 | 7/2008 | Wu |
| 2009/0284947 A1 | 11/2009 | Beddingfield et al. |
| 2009/0294931 A1 | 12/2009 | Sham et al. |
| 2010/0059854 A1 | 3/2010 | Lin et al. |
| 2010/0200965 A1 | 8/2010 | Liao et al. |
| 2010/0214759 A1 | 8/2010 | Beddingfield et al. |
| 2010/0227454 A1 * | 9/2010 | Dohmae .............. H01L 21/78 438/464 |
| 2010/0270661 A1 | 10/2010 | Pagaila et al. |
| 2011/0291032 A1 | 12/2011 | Sun et al. |
| 2011/0304015 A1 | 12/2011 | Kim et al. |
| 2012/0025356 A1 | 2/2012 | Liao et al. |
| 2012/0126378 A1 | 5/2012 | San Antonio et al. |
| 2012/0175784 A1 | 7/2012 | Lin et al. |
| 2012/0187531 A1 | 7/2012 | Lee et al. |
| 2012/0241922 A1 | 9/2012 | Pagaila et al. |
| 2012/0261181 A1 | 10/2012 | Izawa et al. |
| 2012/0273926 A1 | 11/2012 | Pagaila |
| 2012/0292738 A1 | 11/2012 | Lin et al. |
| 2013/0082364 A1 | 4/2013 | Wang et al. |
| 2013/0082368 A1 | 4/2013 | Kim et al. |
| 2013/0256848 A1 | 10/2013 | Kawabata et al. |
| 2013/0285739 A1 | 10/2013 | Blaquiere et al. |
| 2015/0069637 A1 | 3/2015 | Zhao et al. |
| 2015/0237713 A1 | 8/2015 | Elsherbini et al. |
| 2015/0271959 A1 | 9/2015 | Chen et al. |
| 2015/0291911 A1 | 10/2015 | Lalgudi et al. |
| 2015/0382448 A1 | 12/2015 | Pennathur et al. |
| 2016/0007510 A1 | 1/2016 | Cheng |
| 2016/0027740 A1 | 1/2016 | Chiu et al. |
| 2016/0133579 A1 | 5/2016 | Akiba et al. |
| 2016/0307847 A1 | 10/2016 | Lee et al. |
| 2017/0077047 A1 | 3/2017 | Lee et al. |
| 2017/0118877 A1 | 4/2017 | Kumbhat et al. |
| 2017/0179041 A1 | 6/2017 | Dias et al. |
| 2017/0186699 A1 | 6/2017 | Li et al. |
| 2017/0263522 A1 | 9/2017 | Kim et al. |
| 2017/0290155 A1 | 10/2017 | Elsherbini et al. |
| 2017/0330839 A1 | 11/2017 | Kim et al. |
| 2018/0211924 A1 | 7/2018 | Andry et al. |
| 2018/0323128 A1 | 11/2018 | Dias et al. |

* cited by examiner

METHOD FOR SHIELDING SYSTEM-IN-PACKAGE ASSEMBLIES FROM ELECTROMAGNETIC INTERFERENCE

FIELD OF THE INVENTION

The present invention relates to electromagnetic interference (EMI) shielding of electronic packages generally, and more particularly to an EMI shielding film and a method for applying the EMI shielding film to segmented system-in-package (SIP) electronic packages.

BACKGROUND OF THE INVENTION

Electronic devices with increased functionality and reduced size continue to be in demand, and particularly for mobile computing devices such as smart phones and tablets. Such devices, however, typically include circuitry that requires electromagnetic shielding. Some devices, for example, include radio-frequency transceiver circuits that are susceptible to radio frequency interference. Clock signals are another example of sources of radio frequency interference. For the purposes hereof, the term "electromagnetic interference" (EMI) is intended to include broadband wave form signals, including radio-frequency (RF) signals and other frequency signals that emanate from components in the electronic device or from other sources.

Electromagnetic shielding is often used to reduce EMI to the operation of components within an electronic device. Currently, EMI shielding may be formed by metal shielding cans or conductive paste between the circuits. The electrically conductive aspects of the shielding cans or the conductive paste act to mitigate electromagnetic signal transmission, so as to minimize electromagnetic interference with the electronic component operation. Conventional EMI shielding solutions, however, place limitations on package size reduction, and therefore restrict electronic device designers' ability to reduce form factor size in response to user preferences.

A particularly beneficial application of EMI shielding is between segmented components or component groups in a system-in-package (SIP). Components and groups of components may be segmented in a SIP for various reasons, with a segmented portion of the SIP performing a specific function for the system, and may accordingly be placed on the substrate as a pre-defined functional "module". The segmented portions of the SIP are often physically separated by a gap or trench formed in the dielectric overmolding. The segmented portions of the SIP may desirably be shielded from EMI generated by a different portion of the SIP. Consequently, EMI shielding is typically provided about each segmented portion and throughout the SIP, including within the segmenting trenches.

With efforts to decrease total system size, designers have sought to decrease the trench width. However, with typical trench widths now in the range of 10-100 µm, covering the surfaces of the trench with EMI shielding material can be difficult. A conventional approach to EMI shielding has been to coat EMI material into the trench and about the exterior surface of the overmolded dielectric with a combination of printing of electrically conductive paste and sputtering, electro-plating, or spray coating of metal about the exterior surface of the overmolded dielectric material. An example conventional process includes jet printing of a curable liquidous fill material into the trench followed by curing the material and cleaning the exterior surface of the overmolded dielectric to then receive a deposited layer of metal as a conformal coating about the exterior surface of the overmolded dielectric. Such approach is complex and expensive due to the two-step processing to create the EMI shield, and is time consuming as a result of the slow jet filling process and metal deposition process.

Another conventional approach includes printing of a liquidous paste material into the trench and about the exterior surface of the dielectric layer. Applicant has found, however, that EMI shielding pastes are difficult to evenly apply along surfaces of the trenches, particularly for very high aspect ratio (high depth, low width) trench designs. As a result, it is difficult to avoid regions in the trenches that are not adequately shielded.

It is therefore an object of the present invention to provide an EMI shielding application process that eliminates steps from the conventional approach to accelerate throughput and to reduce the costs associated with controlled environments for metal vapor deposition.

It is also an object of the present invention to provide an EMI shielding application process that facilitates high quality and thorough coating of EMI shielding material upon surfaces of an SIP including within high aspect ratio trenches that segment portions of the SIP.

SUMMARY OF THE INVENTION

By means of the present invention, an EMI shielding film may be applied to a system-in-package (SIP) assembly in a single lamination process. An electrically conductive film suitable for EMI shielding is vacuum laminated against an insulating layer, and substantially fills trenches formed into the insulating layer to create a continuous EMI shield both over the package and between segmented portions of the package. The SIP assembly includes a substrate, a plurality of component modules mounted on the substrate, with each component module including one or more components, an insulator covering the components on the substrate, and a trench formed in the insulator between adjacent component modules. The trench has a maximum width of between 10-100 µm.

In some embodiments, a self-supporting shielding pre-form is provided having a tensile modulus of less than 1 GPa at an operating temperature of between 20-250° C. The self-supporting pre-form may be heated to a flowable condition, and vacuum laminated against an exterior surface of the insulator and into the trench to form a coating that may substantially fill the trench and cover the exterior surface of the insulator. The coating may then be cured to a tensile modulus of at least 50 MPa.

In some embodiments, a method for forming a SIP assembly includes providing a substrate having an electrically conductive ground plane spaced from an active surface of the substrate, and an electrically conductive trace extending from said ground plane to said active surface. A plurality of component modules is mounted on the active surface of the substrate to form an assembled surface of the substrate, wherein each component module includes one or more components. The mounted component modules may then be encapsulated in an insulating layer that extends between the assembled surface and an exterior surface. A trench is formed between adjacent component modules and through the dielectric layer to the trace, with the trench having a maximum width of between 10-100 µm. A self-supporting pre-form shielding film is then vacuum laminated against the exterior surface of the dielectric layer and into the trench to form a coating that substantially fills the trench and covers the exterior surface of the dielectric layer. The self-supporting pre-form shielding film exhibits a tensile modulus of less than 1 GPa at an operating temperature of between 20-250° C. The shielding film may also exhibit a volume resistivity of less than 0.1 Ω*cm.

The coating may be pressed against the exterior surface of the dielectric layer, and/or into the trench(es), with a force of at least 50 psi. The pressing may be performed prior to, coincident with, or subsequent to, any curing step required of the coating. If necessary, the coating may be cured to a tensile modulus of at least 50 MPa.

A plurality of SIP devices may be singulated from the assembly by cutting through the substrate and the dielectric layer. One or more of such singulated SIP devices may be mounted on a carrier for use in an electronic device, such as a mobile device. One or more components of the SIP device may include at least a processor, and the SIP device includes at least one of the trenches delineating at least two component modules. The coating that substantially fills the trench preferably attenuates and/or reflects electromagnetic interference by at least 10 db. A mobile device incorporating the SIP device may include a receiver for receiving wireless data, and a transmitter for transmitting wireless data.

DETAILED DESCRIPTION OF THE INVENTION

Figure 1:
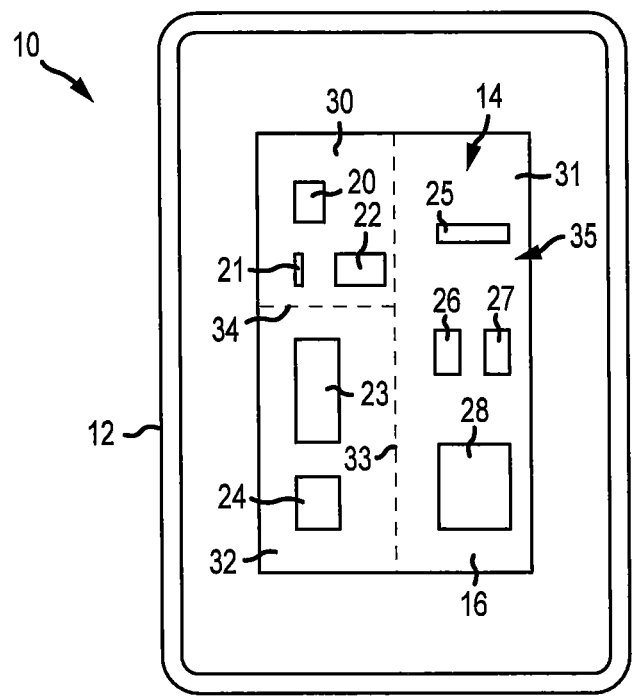
FIG. 1 is a schematic illustration of a portable electronic device including a system-in-package assembly.

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

Unless otherwise apparent or stated, directional references, such as "upper", "lower", "interior", "exterior", "top", "bottom", "vertical", "horizontal", "upward", "downward", "above", "below", and the like are intended to be relative to the orientation of a particular embodiment of the invention as shown in the figures. In addition, a given reference numeral in the drawings indicates the same or similar structure when it appears in different figures and like reference numerals identify similar structural elements and/or features of the subject invention.

Embodiments of the present disclosure describe electromagnetic interference (EMI) shielding methods and configurations. The shielding structures of the present invention mitigate EMI to electrical, mechanical, and other components and subsystems in an electronic device incorporating a system-in-package (SIP) assembly. The single package represented by the SIP may include a plurality of components mounted on a substrate. An example arrangement includes both passive and active components mounted on a printed circuit board (PCB), which are formed from conventional PCB materials such as fiberglass-filled epoxy. It is to be understood that SIP assemblies may be used in electronic devices, such as portable electronic devices including cellular phones, tablets, computers, wristwatches, and the like.

FIG. 1 illustrates an exemplary portable electronic device, such as a mobile device 10 having a housing 12 and an SIP assembly 14, absent any overmolded dielectric. SIP assembly 14 includes a substrate 16, such as a PCB, and a plurality of components 20-28 mounted on substrate 16. Components 20-28 may include active components such as processors, integrated circuits, wireless transceivers, receivers, and transmitters, and passive components, such as resistors and capacitors. As illustrated in FIG. 1, the plurality of components 20-28 may be at least theoretically divided into component modules 30-32, with the delineation being illustrated by dotted lines 33, 34. Components 20-28 may be grouped into different modules based upon their functionality, with components 20-22 included in component module 30, components 25-28 included in component module 31, and components 23, 24 included in component module 32. It may be preferable to shield components of one module from those of another module where, in the absence of such shielding, harmful EMI may affect the performance of respective components. For example, a wireless communications integrated circuit 22 may be located in component module 30 to shield it from signals emanating from, for example, component 25 in component module 31.

Figure 2:
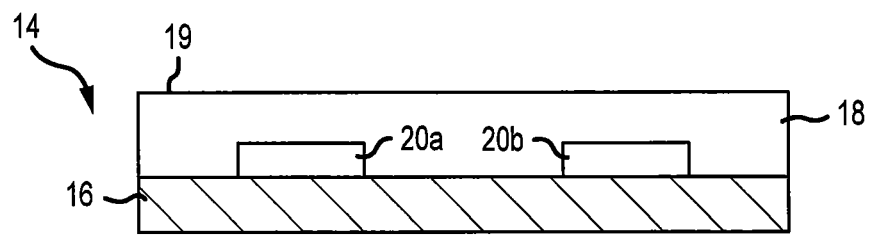
FIG. 2 is a schematic end view of the system-in-package assembly shown in FIG. 1.
Figure 3:
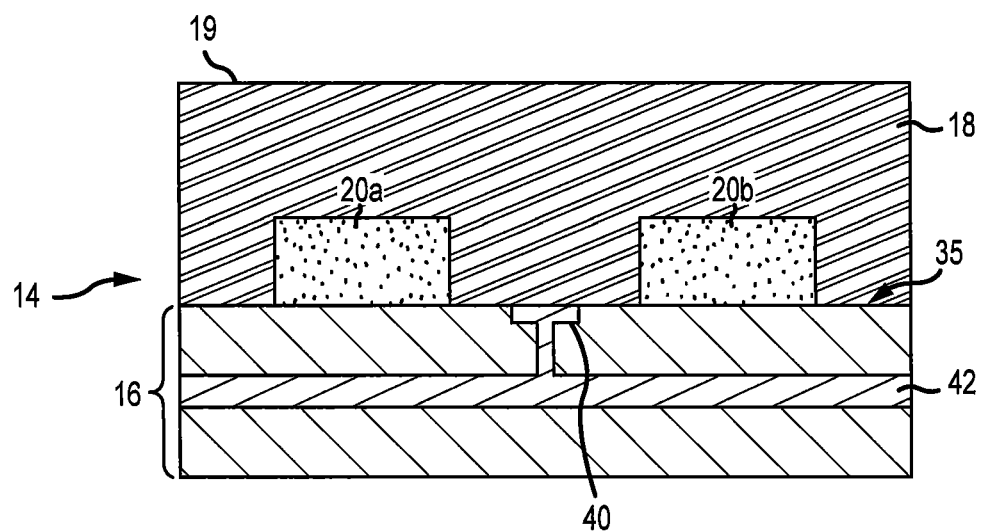
FIG. 3 is a cross-sectional view of a system-in-package assembly.

FIG. 2 is a schematic end view of SIP assembly 14. Schematic components 20a, 20b are mounted on substrate 16 and encapsulated in an overmolded dielectric material forming dielectric layer 18. A plurality of component modules 30-32 on substrate 16 form an assembled surface 35 of substrate 16. The assembled surface 35 extends along a surface of substrate 16 and about components of component modules 30-32. Insulating layer 18 may encapsulate assembled surface 35, wherein insulating layer 18 extends between assembled surface 35 and an exterior surface 19.

Insulating layer 18 may be formed from various materials, such as epoxy, or generally thermoset materials, thermoplastic materials, or other materials useful in electrically insulating assembled surface 35. In some embodiments, insulating layer 18 may be formed from materials that are both electrically insulating and thermally conductive to facilitate thermal transfer away from components 20-28. Insulating layer 18 may in some embodiments be referred to as a dielectric, or a dielectric layer.

Substrate 16 may be a printed circuit board (PCB) of electrically insulative material such as an epoxy laminate. For example, substrate 16 may include electrically insulating layers of materials such as polytetrafluoroethylene, phenolic cotton paper materials such as Flame Retardant 4 (FR-4), FR-1, cotton paper and epoxy materials such as CEM-1 or CEM-3, or woven glass material that are laminated together using an epoxy resin material. Interconnect structure such as traces, trenches, vias, may be formed through the electrically insulating layers to route the electrical signals of components 20-22 through the substrate 16.

Substrate 16 may include metal traces 40 electrically coupled to a ground plane 42. Metal traces 40 and ground plane 42 may preferably be formed from materials that are electrically conductive, and may protect substrate 16 from damage from cutting processes, including the formation of trenches, as described in greater detail hereinbelow. In some embodiments, metal traces 40 may be capable of reflecting incident laser energy used in cutting/ablating portions of insulating layer 18 to form the trenches.

Figure 4:
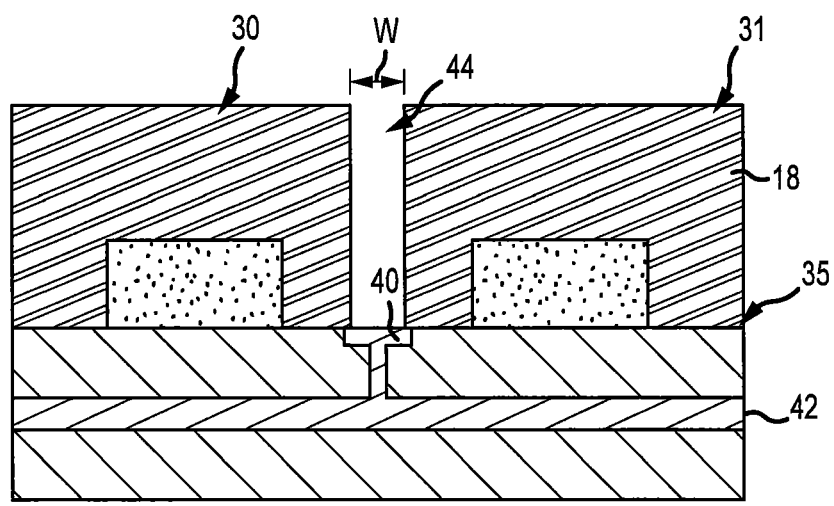
FIG. 4 is a cross-sectional view of a system-in-package assembly with a trench formed in the dielectric layer.

A cutting device, such as a laser, may form one or more trenches 44 in insulating layer 18. Trenches 44 delineate component modules 30-32, typically as a region in which to deposit EMI shielding material in order to shield EMI from propagating from one component module to an adjacent component module. As illustrated in FIG. 4, trench 44 may be formed between adjacent component modules 30, 31 and through insulating layer 18 to trace 40. In embodiments for forming trench 44 with a laser cutting tool, trace 40 may be capable of reflecting the laser energy to effectively act as a stop to laser cutting/ablation penetration into SIP 14. Trace 40 also acts as an electrically conductive contact point at assembled surface 35 exposed to trench 44. EMI shielded at trench 44 may therefore be conducted to ground plane 42 through trace 40. Trench 44 may have a maximum width dimension "w" of between 10-100 µm.

As described above, it is known to deposit a thin conductive shielding layer in the trench to shield EMI between the component modules. Such conventional shielding layers are typically deposited through chemical vapor deposition, physical vapor deposition, or electrochemical plating techniques, and are formed from conductive metals such as copper or aluminum. Conventional approaches to EMI shielding then apply a separate EMI shielding layer to an exterior surface of the insulating layer to cover the upper and side surfaces of the insulating layer. This separate shielding layer operates in conjunction with the trench shielding layer described above to effectuate a thin "shielding can" that extends into the trench between component modules.

Figure 5:
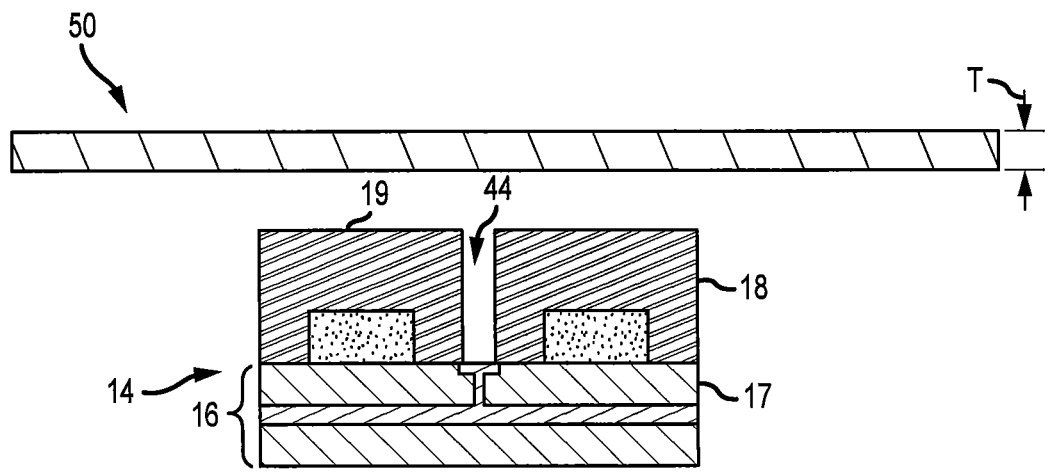
FIG. 5 is an illustration of an EMI shielding film and a system-in-package assembly.
Figure 6:
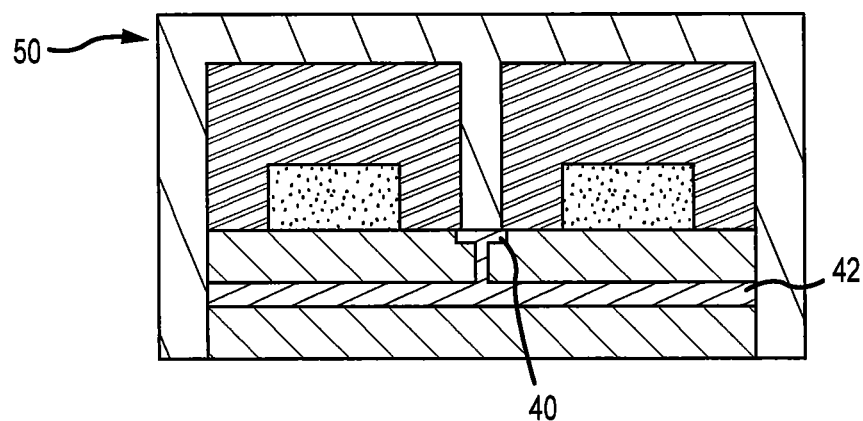
FIG. 6 is a cross-sectional view of an EMI shielding film laminated at a system-in-package assembly.

In an embodiment, illustrated in FIGS. 5-7, an EMI shielding material is provided in a self-supporting film pre-form 50, which may be laminated in a single lamination process on SIP 14 to coat trench 44, and to cover at least exterior surface 19 of insulating layer 18. EMI shielding film pre-form 50 may also be laminated to cover the side edges 17 of substrate 16, and to electrically contact conductive plane 42 at one or more side edges 17 of substrate 16. The lamination of EMI shielding film pre-form 50 may be performed in a single lamination process to provide EMI shielding both within trench 44, and about an exterior surface of SIP 14. By applying an EMI shielding layer both within trench 44 and about exterior surface 19 with a single self-supporting film, processing throughput of EMI-shielded SIP units may be greatly accelerated.

EMI Shielding Material

EMI shielding film pre-form 50 is preferably an electrically conductive, self-supporting body that is capable of effectively attenuating and/or reflecting at least certain frequencies of electromagnetic radiation. EMI shielding may include one or more of reflection and absorption of incident energy, and it is contemplated that the shielding film of the invention is capable of either or both traits. The EMI shielding material useful in the present invention may exhibit a volume resistivity of less than 0.1 Ω*cm, preferably between about $2.0*10^{-6}$ and 0.1 Ω*cm, and may by between about $5.0*10^{-6}$ and $1.0*10^{-2}$ Ω*cm. "Effective EMI shielding" is intended to mean between 1-200 dB/5 µm at between 10 MHz and 10 GHz.

An aspect of EMI shielding film pre-form 50 is that it exhibits sufficient flexibility/elongation to be formed about SIP 14 and into the narrow trench 44 in a single lamination process. In order to maintain the compactness of boards employing SIPs, trenches 44 are desirably as narrow as possible, with a maximum width dimension "w" of between 1-100 µm. Applicant has found that it is difficult to successfully apply conventional conductive pastes to both substantially fill trench 44 and cover exterior surface 19 of insulating layer 18. EMI shielding film pre-form 50 may therefore be a flexible but self-supporting film. For the purposes hereof, the term "self-supporting film" shall mean a film having a thickness of less than 0.5 mm and that is capable of maintaining its three-dimensional configuration at 20° C. without configuration-maintaining support. The term "configuration-maintaining support" is intended to mean structure that contacts the film against an applied force to maintain an initial configuration of the film defined in the absence of such applied force.

EMI shielding film pre-form 50, as described above, is preferably a self-supporting film having a thickness "t" of between 1-500 µm, preferably 5-200 µm, and more preferably 5-80 µm. The film thickness may be substantially uniform. Film pre-form 50 may also preferably be flexible, having an elongation of at least 2%, preferably at least 3%, and more preferably at least 5% at 20° C. Elongation of the film may be determined using a stress-strain test method on an Instron 5566 using a 50 N load cell at 25 mm/min load speed. The film tested had dimensions of 5 mm×10 mm×0.3 mm thick. EMI shielding film pre-form 50 may be substantially non-tacky at 20° C.

EMI shielding film pre-form 50 may be formed from a polymer matrix and a filler dispersed in the polymer matrix. Example electrically conductive fillers include metals in particulate format such as copper, aluminum, silver, gold, metal alloys such as nickel-iron alloys, and other electrically conductive materials. Example magnetic interference absorption fillers include iron, nickel, and nickel-iron alloys. In an embodiment, the polymer matrix of EMI shielding film pre-form 50 may include thermoplastic or thermosetting resins, including, for example, epoxy resins, polyurethane resins, and polyacrylate resins.

In some embodiments, EMI shielding film pre-form 50 may include multiple layers, including layers with different EMI shielding properties. Various layers of a multiple-layer pre-form 50 may be polymer-based or non-polymer-based, including one or more metal foil layers. Different layers of a multiple-layer film used as pre-form 50 may absorb and/or reflect different or overlapping frequency ranges of electromagnetic radiation. In some embodiments, layers of a multiple layer film or pre-form 50 may have different or overlapping physical properties, such as elongation, tensile modulus, volume resistivity, thermal conductivity, glass transition temperature, etc. In some embodiments, EMI shielding film pre-form 50 may be thermally conductive, having a thermal conductivity at least along a thickness direction of at least 0.5 W/m*K, and more preferably at least about 1.0 W/m*K.

EMI shielding film pre-form 50 may in some embodiments be considered a conductive adhesive.

The EMI shielding material may be curable, wherein self-supporting EMI shielding film pre-form 50 may be in a pre-cured state for lamination at SIP 14. A pre-cured film pre-form 50 may exhibit a tensile modulus of less than 1 GPa at operating temperatures of between 20-250° C., but maintains structural properties sufficient to be self-supporting at 20° C. In some embodiments, a laminated pre-form 50 may cure with elevated temperature, for example at greater than 60° C. for at least ten minutes, and preferably at a temperature of at least 100° C. for at least twenty minutes. EMI shielding film pre-form 50 may also or instead be curable through other cure mechanisms, including irradiation and catalyst addition. A cured lamination from pre-form 50 may exhibit a tensile modulus of greater than 50 MPa, greater than 250 MPa, or greater than 1 GPa at 20° C. In other embodiments, self-supporting EMI shielding film pre-form 50 may be non-curable, or in a cured state, with no substantial further crosslinking required or available during or after lamination at SIP 14. In either case, EMI shielding film pre-form 50 is preferably a self-supporting body that may be applied to SIP 14 and laminated into a coating within trenches 44 and about exterior surface 19.

Lamination Process

EMI shielding film pre-form 50 may be secured to SIP 14 in a single lamination process. In one embodiment, EMI shielding film pre-form 50 may be vacuum laminated against exterior surface 19 of insulating layer 18, and optionally further against side surfaces 17 of substrate 16. The vacuum lamination preferably forms a coating in trench 44 and covers exterior surface 19 of insulating layer 18, and optionally covers side surfaces 17 of substrate 16. A preferred arrangement of a vacuum laminated EMI shielding film pre-form 50 onto SIP 14 is illustrated in FIG. 6.

Figure 6A:
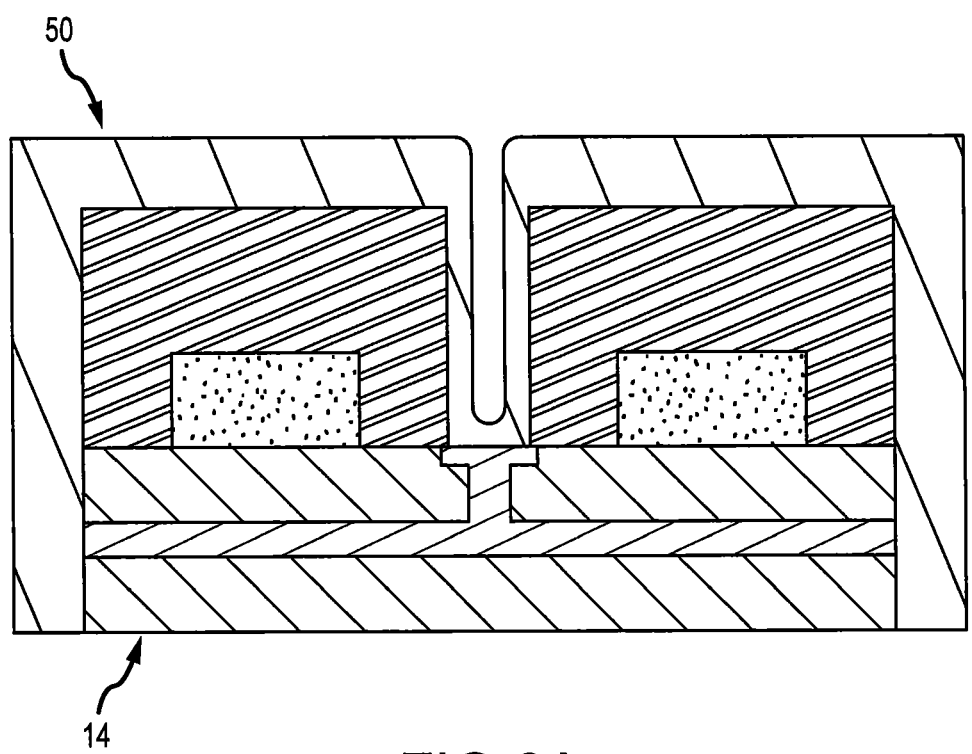
FIG. 6A is a cross-sectional view of an EMI shielding film laminated at a system-in-package assembly.

The lamination of pre-form 50 onto SIP 14 may, in some embodiments, substantially fill trench 44 and cover exterior surface 19 of insulating layer 18. To "substantially fill" trench 44, the EMI shielding material eliminates or nearly eliminates all void space defined by trench 44 in insulating layer 18. In other embodiments, however, the lamination of pre-form 50 onto SIP 14 forms a coating in trench 44, as illustrated in FIG. 6A. Such coating preferably encapsulates respective components 20a, 20b by forming a continuous EMI shielding layer between conductive points at metal trace 40 and grounding plane 42, around a respective component module 30-32. The laminated coating may have a thickness of between about 1-500 μm, preferably between about 5-200 μm, and more preferably between about 5-80 μm.

An example process for applying EMI shielding film pre-form 50 includes heating pre-form 50 to a flowable condition. For the purposes hereof, the term "flowable condition" shall mean a tensile modulus of less than 1 GPa. In some embodiments, EMI shielding film pre-form 50 may be heated to at least 50° C. to achieve a flowable condition, and preferably between 50 and 175° C. In other embodiments, EMI shielding film pre-form 50 need not be heated above ambient room temperature, or 20° C., prior to, or concurrently with lamination, such that self-supporting pre-form 50 is in a sufficiently flowable condition for vacuum lamination at ambient room temperature, or 20° C.

The heated or non-heated EMI shielding film pre-form 50 may be vacuum laminated against SIP 14, including exterior surface 19 of insulating later 18, and into trench 44 to form a coating in trench 44 and covering exterior surface 19 of insulating layer 18. EMI shielding film pre-form 50 may also be laminated against an exterior surface of insulating layer 18, side surfaces 17 of substrate 16, and into trench 44 to form a coating substantially filling trench 44 and covering exterior surface 19 of insulating layer 18, and side surfaces 17 of substrate 16. EMI shielding film pre-form 50 may be laminated to establish electrical contact with one or both of grounding plane 42 and metal trace 40. EMI shielding film pre-form 50 may also be laminated in order to establish electrical contact with one or more electrically conductive regions of SIP 14.

Figure 7A:
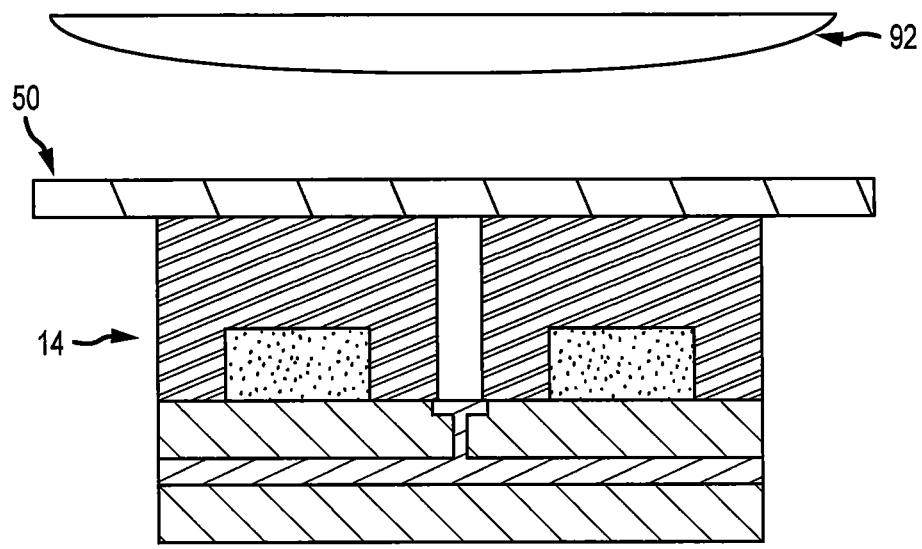
FIG. 7A is a cross-sectional view of an EMI shielding film placed at a system-in-package assembly, and a deflated pressure bladder.
Figure 7B:
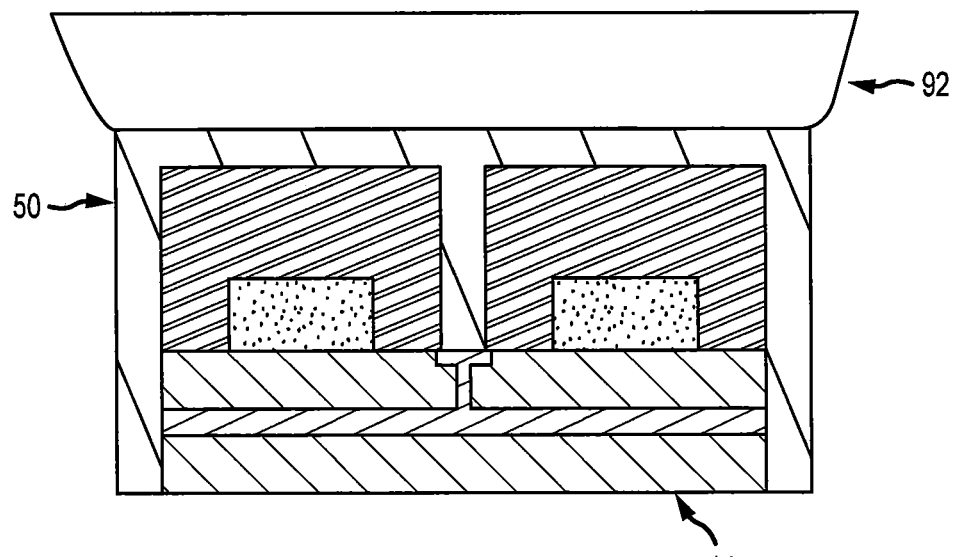
FIG. 7B is a cross-sectional view of an EMI shielding film laminated and pressed by an inflated pressure bladder at a system-in-package assembly.

EMI shielding film pre-form 50 may be applied to SIP 14 through a vacuum laminating process, which includes placing pre-form 50 at exterior surface 19 of insulating layer 18, and positioning the assembly in a laminating chamber of a vacuum laminator, whereupon temperature is set to between 0 and 200° C., preferably between 20-175° C., and more preferably between 25-75° C. and pressure is decreased to less than 500 mm Hg, preferably less than 250 mm Hg, and more preferably between 100-200 mm Hg. In some embodiments, such temperature and pressure conditions are maintained for 1-10 minutes. As the reduced pressure is applied beneath the film pre-form in the void areas of SIP 14, a force may be applied to an upper surface of the film to press the film against exterior surface 19 of insulating layer 18 and into trench 44. A pressing force of at least 50 psi, and preferably between 0.1-1.0 MPa may be applied by an inflatable bladder, inflated against pre-form 50 while the reduced pressure is applied in the void areas of SIP 14. FIGS. 7A-7B illustrate inflatable bladder 92 inflating and applying force against film pre-form 50 in the lamination process. The pressing force and reduced pressure act to laminate pre-form 50 against exterior surface 19 of insulating layer 18, and into trench 44.

Figure 7C:
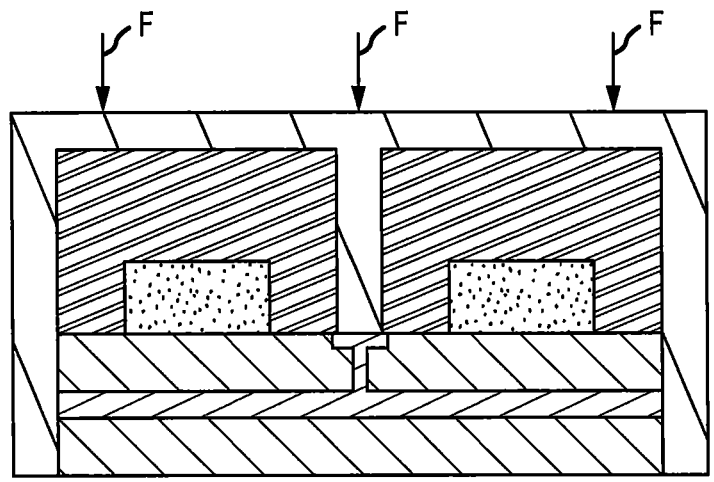
FIG. 7C is a cross-sectional view of an EMI shielding film laminated and pressed at a system-in-package assembly.

The coating formed by laminating pre-form 50 onto SIP 14 may be pressed against exterior surface 19 of insulating layer 18 with the force of at least 50 psi. Application of such pressing force is illustrated in FIG. 7C, and represented by force arrows "F". The pressing force "F" may be applied with a press mechanism to further force EMI shielding film pre-form 50 against exterior surface 19 of insulating layer 18, and into trench 44. The pressing force "F" may be supplied by inflatable bladder 92 of the vacuum laminator, or a press anvil (not shown).

The coating formed by the laminated EMI shielding film pre-form 50 may be cured in place prior to, simultaneously with, subsequent to, or in the absence of, a pressing operation as illustrated in FIGS. 7A-7C. In some embodiments, the coating may be cured to a tensile modulus of at least 1 GPa at 20° C.

Figure 8:
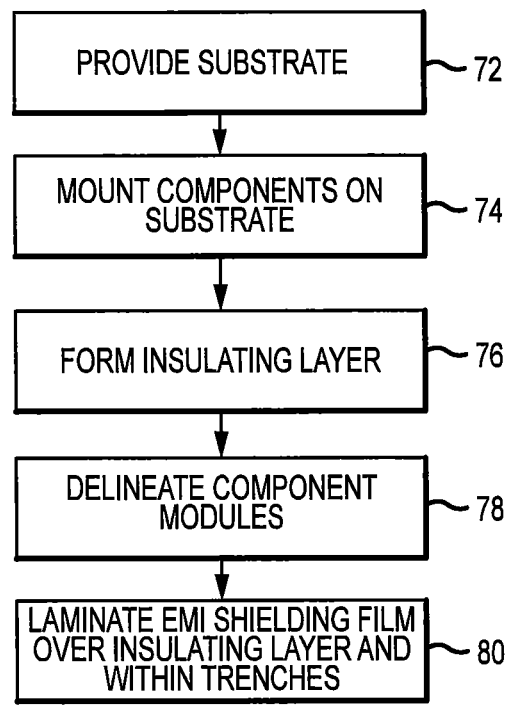
FIG. 8 is a flow diagram for forming a system-in-package assembly with an EMI shielding film.

FIG. 8 illustrates a flow diagram for forming an SIP assembly with EMI shielding film. The process includes providing a substrate or PCB in step 72. As shown in step 74, components are mounted on the surface of the substrate. An insulating layer is formed in step 76 using a desired process. For example, the insulating layer may be molded and subsequently transferred to the assembled surface of the substrate, or may be molded in place at the assembled surface of the substrate. As is known in the art, the insulating layer may be injection molded, sintered, matrix molded, compression molded, extrusion molded, and the like. For forming the insulating layer in place, the dielectric material may be molded in place or deposited through a deposition process.

Component modules may be delineated in step 78 by cutting or ablating a channel/trench in the insulating layer along a delineating border. Cutting tools suitable for creating the delineating trench/channel include laser cutting tools, sawing tools, or machining tools.

An EMI shielding film is then laminated over the insulating layer and within the trenches/channels in step 80. The laminated EMI shielding layer coats the trenches/channels, and establishes electrical contact with metal traces and a ground plane to form an EMI shield around respective component modules. The EMI shielding layer is formed from an EMI shielding film pre-form, which may be a self-supporting film having physical properties that facilitate desirable lamination over the insulating layer and within the trenches/channels.

Batch Processing

Figure 9:
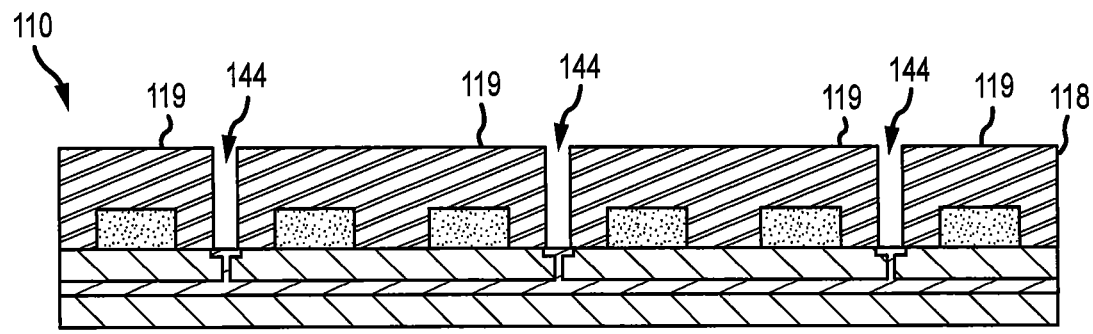
FIG. 9 is a cross-sectional view of an array of components mounted on a substrate and delineated into a plurality of component modules.
Figure 10:
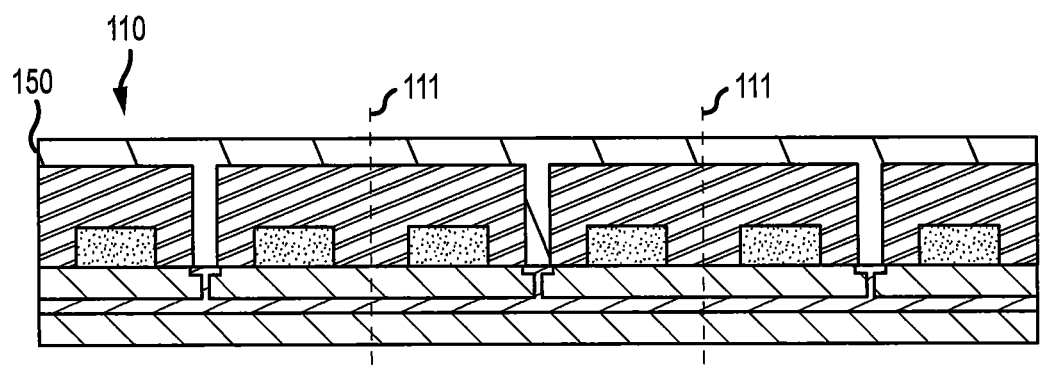
FIG. 10 is a cross-sectional view of the array illustrated in FIG. 9 with an EMI shielding film laminated thereto.
Figure 11:
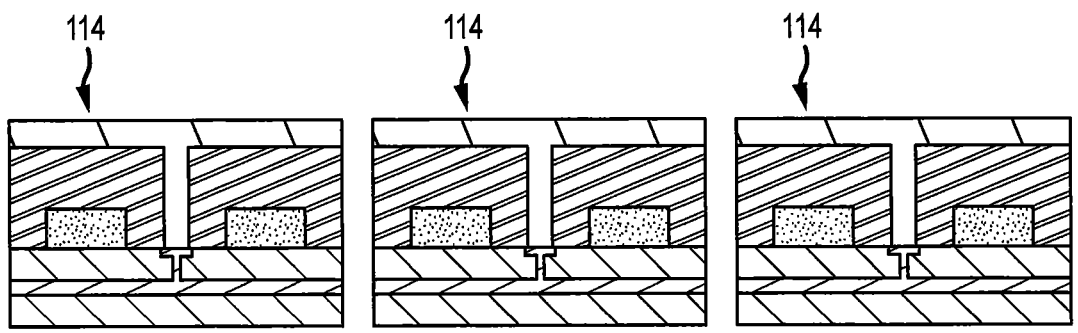
FIG. 11 is a cross-sectional view of a plurality of system-in-package devices singulated from the array illustrated in FIG. 10.
Figure 12:
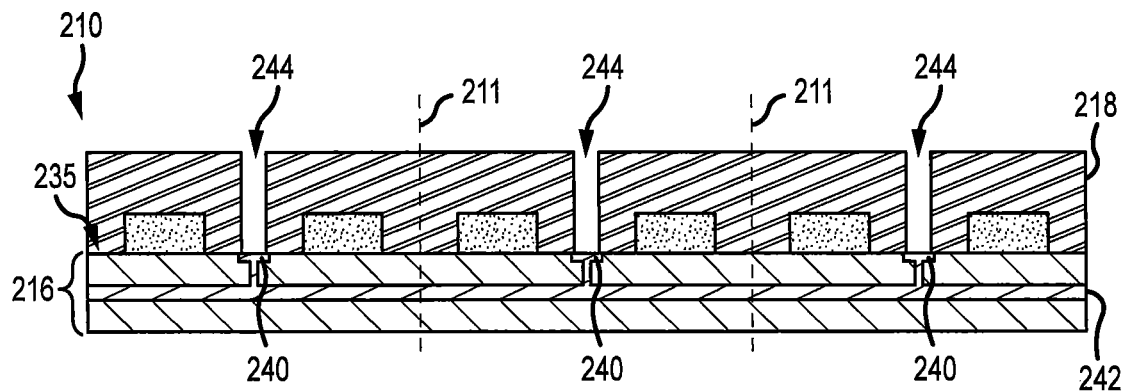
FIG. 12 is a cross-sectional view of components mounted on a substrate and delineated into a plurality of component modules.

In some embodiments, a plurality of SIP devices may be simultaneously EMI shielded in a batch process prior to singulation. An array 110 of components mounted on a substrate and delineated into a plurality of component modules is illustrated in FIG. 9. An EMI shielding film 150 may be laminated, such as by vacuum lamination, onto array 110 to coat trenches 144 and to cover exterior surface 119 of dielectric array 118. The lamination of EMI shielding film 150 onto array 110 may be performed in a single lamination process, as described above with respect to SIP 14. Subsequent to the lamination process, including any pressing and/or curing of EMI shielding film 150, a plurality of SIP devices 114 may be singulated from array 110 by cutting through array 110 and EMI shielding film 150 at cut lines 111. In this manner, a plurality of SIP devices 114 may be created in a single batch process, including a single EMI shielding film lamination process.

Figure 13:
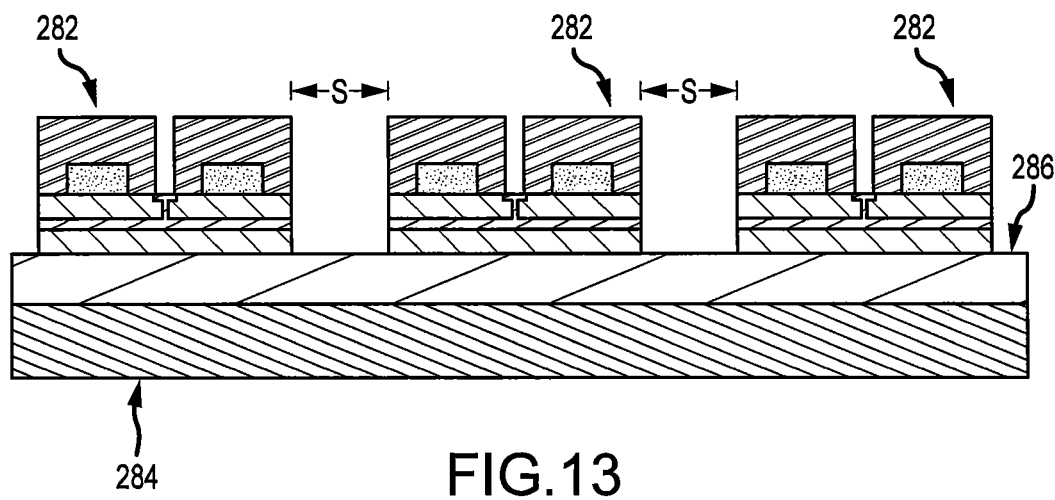
FIG. 13 is a cross-sectional view of sub-array devices from FIG. 12 mounted to a carrier.
Figure 14:
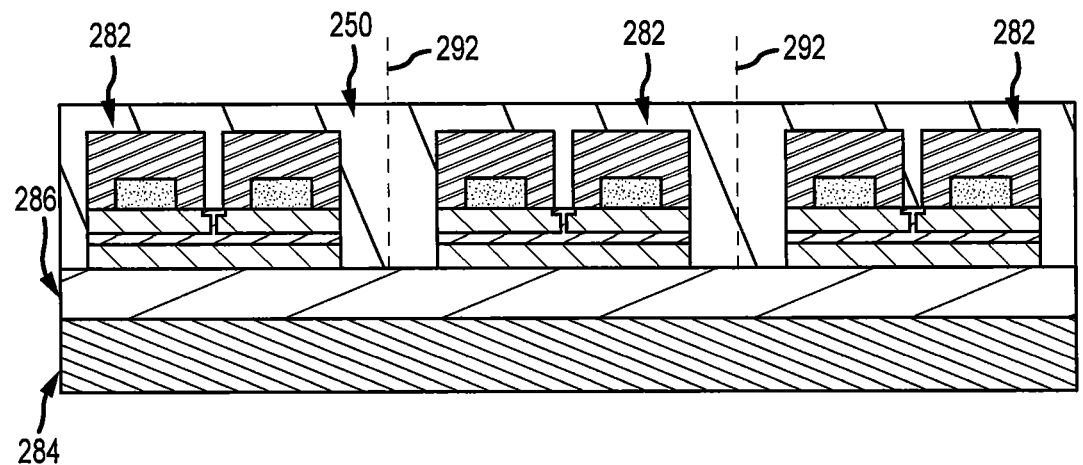
FIG. 14 is a cross-sectional view of the plurality of sub-array devices illustrated in FIG. 13 with an EMI shielding film laminated thereto.
Figure 15:
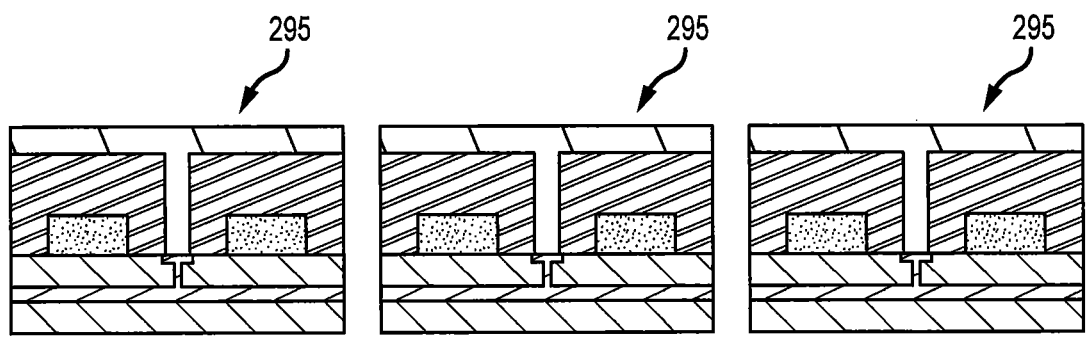
FIG. 15 is a cross-sectional view of singulated system-in-package devices.
Figure 16:
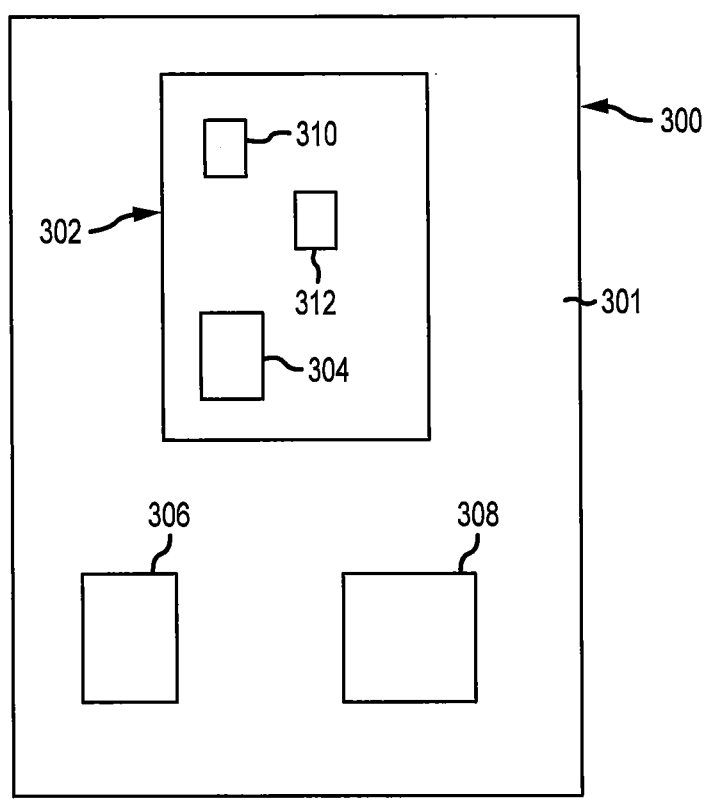
FIG. 16 is a schematic illustration of a mobile device incorporating a system-in-package device of the present invention.

An alternative batch process is illustrated in FIGS. 12-15, wherein an array 210 is formed by mounting a plurality of components on a substrate 216, such as a PCB, having a ground plane 242 and a plurality of conductive traces 240 conductively coupled to ground plane 242 and extending to an upper surface of substrate 216 that forms a portion of assembled surface 235. The components may be encapsulated in a dielectric array 218. Array 210 may be cut with various cutting tools along cut lines 211 to initially separate the array into sub-array devices 282 that may be mounted onto a carrier 284 with an adhesive 286, as shown in FIG. 13. Sub-array devices 282 may be placed at carrier 284 with sufficient spacing "S" to permit the formation of an EMI shielding film at respective facing surfaces of adjacent sub-array devices 282 while positioned at carrier 284. An EMI shielding film 250 is applied to the arrangement illustrated in FIG. 13 through a lamination process, such as a vacuum lamination process, to encapsulate exposed surfaces of sub-array devices 282, including within, and in some embodiments to substantially fill, trenches 244. The laminated arrangement is illustrated in FIG. 14. The sub-array devices 282 may then be singulated into a plurality of EMI-shielded SIPs, formed by cutting through EMI shielding film 250 at cut lines 292 and removing the sub-array devices 282 from engagement with carrier 284. The plurality of singulated SIP 295 devices is shown in FIG. 15. A mobile device 300 incorporating the SIP devices of the present invention is illustrated schematically in FIG. 16. SIP device 302 is mounted on a housing 301, and includes at least a processor 304. Other relevant components of mobile device 300 include a receiver 306 for receiving wireless data, and a transmitter 308 for transmitting wireless data.

In some embodiments, SIP device 302 may also include memory devices 310 and a plurality of passive components, schematically illustrated as element 312. It is to be understood that mobile device 300 may include several other components and elements to make mobile device 300 fully operational, though such components and elements are not shown for the sake of simplicity.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. A mobile device, comprising:
   a housing;
   a receiver for receiving wireless data;
   a transmitter for transmitting wireless data; and
   a system in package assembly, the system in package assembly comprising
      a substrate,
      a plurality of component modules mounted on the substrate, with each component module including one or more components,
      an insulator covering the components on the substrate, and
      a trench formed in the insulator between adjacent component modules, wherein the trench has a maximum width of between 10-100 µm,
      a coating in the trench, formed from a self-supporting EMI shielding film pre-form having a tensile modulus of less than 1 GPa at between 20-250° C., covering the exterior surface of the insulator and having a tensile modulus of at least 50 MPa,
      wherein said system in package assembly is mounted on said housing,
   wherein the one or more components of said system in package assembly includes at least a processor, and
   wherein the system in package assembly includes at least one of said trenches delineating at least two component modules,
   wherein said coating substantially filling said trench attenuates electromagnetic interference by at least 10 db.

* * * * *